United States Patent [19]
Luter et al.

[11] Patent Number: 5,922,127
[45] Date of Patent: Jul. 13, 1999

[54] HEAT SHIELD FOR CRYSTAL PULLER

[75] Inventors: William L. Luter; Lee W. Ferry, both of St. Charles, Mo.

[73] Assignee: MEMC Electronic Materials, Inc., St. Peters, Mo.

[21] Appl. No.: 08/940,166

[22] Filed: Sep. 30, 1997

[51] Int. Cl.$^6$ .................................................. C30B 35/00
[52] U.S. Cl. ........................... 117/217; 117/200; 117/222
[58] Field of Search .................................. 117/200, 201, 117/202, 208

[56] References Cited

U.S. PATENT DOCUMENTS

| | | | |
|---|---|---|---|
| 3,740,563 | 6/1973 | Reichard | 117/15 |
| 4,350,557 | 9/1982 | Scholl et al. | 117/15 |
| 4,710,258 | 12/1987 | Latka | 117/15 |
| 4,854,959 | 8/1989 | Waltert | 65/335 |
| 4,926,357 | 5/1990 | Katsuoka et al. | 702/157 |
| 4,981,549 | 1/1991 | Yamashita et al. | 117/3 |
| 5,138,179 | 8/1992 | Baba et al. | 117/15 |
| 5,170,061 | 12/1992 | Baba | 117/15 |
| 5,178,720 | 1/1993 | Frederick | 117/20 |
| 5,183,528 | 2/1993 | Baba et al. | 117/15 |
| 5,240,684 | 8/1993 | Baba et al. | 117/14 |
| 5,248,378 | 9/1993 | Oda et al. | 117/217 |
| 5,264,189 | 11/1993 | Yamashita et al. | 117/204 |
| 5,288,363 | 2/1994 | Araki | 117/15 |
| 5,378,900 | 1/1995 | Hirano et al. | 117/201 |
| 5,437,242 | 8/1995 | Hofstetter et al. | 117/14 |
| 5,653,799 | 8/1997 | Fuerhoff | 117/14 |

FOREIGN PATENT DOCUMENTS

| | | |
|---|---|---|
| 0450502A1 | 10/1991 | European Pat. Off. . |
| 63-239181 | 10/1988 | Japan . |
| 63-256594 | 10/1988 | Japan . |
| 04-300283 | 10/1992 | Japan . |
| 07-033587 | 2/1995 | Japan . |
| 08-091980 | 4/1996 | Japan . |

*Primary Examiner*—Felisa Hiteshew
*Attorney, Agent, or Firm*—Senniger, Powers, Leavitt & Roedel

[57] ABSTRACT

A heat shield for use in a crystal puller around a monocrystalline ingot grown out of a crucible in the crystal puller filled with molten semiconductor source material. The heat shield includes a reflector having a central opening sized and shaped for surrounding the ingot as the ingot is grown to reduce heat transfer from the crucible. The reflector is adapted to be supported in the crystal puller between the molten material and a camera aimed toward at three separate points on a meniscus formed between the ingot and an upper surface of the molten material. The reflector has at least three passages extending through the reflector. Each of the passages is located along an imaginary line extending between the camera and one of the points on the meniscus. This permits the camera to view the points so the positions of the points can be determined by the camera for calculating the diameter of the ingot while minimizing heat loss through the passages.

13 Claims, 3 Drawing Sheets

AXIAL TEMPERATURE GRADIENT VS. INGOT SURFACE TEMPERATURE

AXIAL TEMPERATURE GRADIENT VS. RADIUS (AT SOLIDIFICATION INTERFACE)

HEAT SHIELD FOR CRYSTAL PULLER

BACKGROUND OF THE INVENTION

The present invention relates to a crystal puller for growing single crystal semiconductor material, and more particularly to a heat shield for use in such crystal pullers.

Single crystal semiconductor material, which is the starting material for fabricating many electronic components, is commonly prepared using the Czochralski ("Cz") method. In this method, polycrystalline semiconductor source material such as polycrystalline silicon ("polysilicon") is melted in a crucible. Then a seed crystal is lowered into the molten material and slowly raised to grow a single crystal ingot. As the ingot is grown, an upper end cone is formed by decreasing the pull rate and/or the melt temperature, thereby enlarging the ingot diameter, until a target diameter is reached. Once the target diameter is reached, the cylindrical main body of the ingot is formed by controlling the pull rate and the melt temperature to compensate for the decreasing melt level. Near the end of the growth process but before the crucible becomes empty, the ingot diameter is reduced to form a lower end cone which is separated from the melt to produce a finished ingot of semiconductor material.

In order to control the diameter of the ingot, the actual diameter of the ingot must be measured throughout the pulling process. A camera is mounted above the crucible for automatically determining the diameter of ingots as they are pulled. The camera measures the positions of at least three points on a meniscus formed between the ingot and an upper surface of the molten material. The camera is able to distinguish the meniscus from the surrounding material because the meniscus appears brighter than the surrounding material. The diameter of the ingot can be calculated from these points using geometric formulas which are well known by those skilled in the art.

Although the conventional Cz method is satisfactory for growing single crystal semiconductor materials for use in a wide variety of applications, further improvement in the quality of semiconductor material is desirable. For instance, as semiconductor manufacturers reduce the width of integrated circuit lines formed on semiconductors, the presence of defects in the material becomes of greater concern. Defects in single crystal semiconductor materials form as the crystals solidify and cool in the crystal puller. Such defects arise, in part, because of the presence of an excess (i.e., a concentration above the solubility limit) of intrinsic point defects known as vacancies and self-interstitials. Vacancies, as their name suggests, are caused by the absence or "vacancy" of one or more atoms in the crystal lattice. Self-interstitials are produced by the presence of one or more extra atoms in the lattice. Both kinds of defects adversely affect the quality of the semiconductor material.

Ingots are typically grown with an excess of one or the other type of intrinsic point defect, i.e., either crystal lattice vacancies or self-interstitials. It is understood that the type and initial concentration of these point defects in the ingots, which become fixed as they solidify, are controlled by the ratio of the growth velocity (i.e., the pull rate) (v) to the instantaneous axial temperature gradient in the ingot at the time of solidification ($G_o$). When the value of this ratio ($v/G_o$) exceeds a critical value, the concentration of vacancies increases. Likewise, when the value of $v/G_o$ falls below the critical value, the concentration of self-interstitials increases. Although neither type of defect is desirable, growth regimes which produce more vacancies are preferred, in general, by the semiconductor industry. The density of intrinsic point defects may be reduced by controlling $v/G_o$ to grow a crystal lattice in which crystal lattice vacancies are the dominant intrinsic point defect, and by reducing the nucleation rate of agglomerated defects by altering (usually, by lowering) the thermal gradient $G_o$ in the silicon ingot when its temperature is within a range of about 1150° C. to 1050° C. during the crystal pulling process.

In order to produce vacancy rich ingots, and avoid the presence of a radial vacancy/self-interstitial boundary ring in the ingots, $v/G_o$ is controlled to be as high as possible. One way to increase this ratio is to increase the pull rate (i.e., growth velocity, v) of the ingot. However, the pull rate also affects other parameters, such as the ingot diameter. Thus, the amount the pull rate may be increased is limited.

The other way to increase the ratio is to reduce the thermal gradient $G_o$ in the ingot. To this end, a heat shield may be positioned within the crucible above the melt surface for conserving heat at the interface between the ingot and the molten material to prevent heat loss from the melt surface. In this way, the instantaneous axial thermal gradient $G_o$ at the interface is reduced, which increases the ratio $v/G_o$. These heat shields generally include a central opening through which the ingot is pulled as it is grown from the melt. In the past, the central opening was made large enough to permit the camera which determines the ingot diameter to view the points on the meniscus through the opening. Otherwise, the shield would have obstructed the view of the camera. Since the central opening was relatively large to enable the camera to view the points, a considerable amount of heat escaped upward past the shield, thereby significantly reducing the effectiveness of the heat shield.

SUMMARY OF THE INVENTION

Among the several objects and features of the present invention may be noted the provision of a heat shield and a crystal puller which facilitate growth of high quality single crystal ingots; the provision of such a heat shield and crystal puller which reduce the instantaneous axial temperature gradient of the crystal adjacent the surface of the melt; the provision of such a heat shield and crystal puller which do not interfere with automated crystal diameter measuring apparatus; the provision of such a heat shield which facilitates high throughput in the crystal puller; the provision of such a heat shield which is capable of operating in a confined space within a crystal puller; the provision of such a heat shield which is readily adapted to existing crystal pullers; and the provision of such a heat shield assembly and method which is easy to use.

Briefly, apparatus of this invention is a heat shield for use in a crystal puller around a monocrystalline ingot grown out of a crucible in the crystal puller filled with molten semiconductor source material. The heat shield comprises a reflector having a central opening sized and shaped for surrounding the ingot as the ingot is grown to reduce heat transfer from the crucible. The reflector is adapted to be supported in the crystal puller between the molten material and a camera aimed toward at least three separate points on a meniscus formed between the ingot and an upper surface of the molten material. The reflector has at least three passages extending through the reflector. Each of the passages is located along an imaginary line extending between the camera and one of the points on the meniscus. This permits the camera to view the points so the positions of the points can be determined by the camera for calculating the diameter of the ingot while minimizing heat loss through the passages.

In another aspect of the invention, apparatus of the invention is a crystal puller for forming a monocrystalline ingot. The crystal puller comprises a crucible for holding molten semiconductor source material from which the monocrystalline ingot is grown and a heater for heating the crucible. The puller also comprises a pulling mechanism for pulling the ingot from the molten material and a camera positioned about the molten material. The camera is aimed toward at least three separate points on a meniscus formed between the ingot and an upper surface of the molten material. In addition, the puller comprises a heat shield located between the molten material and the camera. The heat shield has a central opening sized and shaped for surrounding the ingot as the ingot is grown to reduce heat transfer from the crucible. The heat shield has at least three passages extending through the heat shield. Each of the passages is located along an imaginary line extending between the camera and one of the points on the meniscus. This permits the camera to view the points so the positions of the points can be determined for calculating the diameter of the ingot while minimizing heat loss through the passages.

In yet another aspect of the present invention, the apparatus of this invention is a heat shield comprising a reflector having a circular central opening for surrounding the ingot as the ingot is grown to reduce heat transfer from the crucible. The central opening has a diameter which is no more than about ten percent larger than a predetermined maximum target diameter of the ingot around at least about 325 degrees of its circumference.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
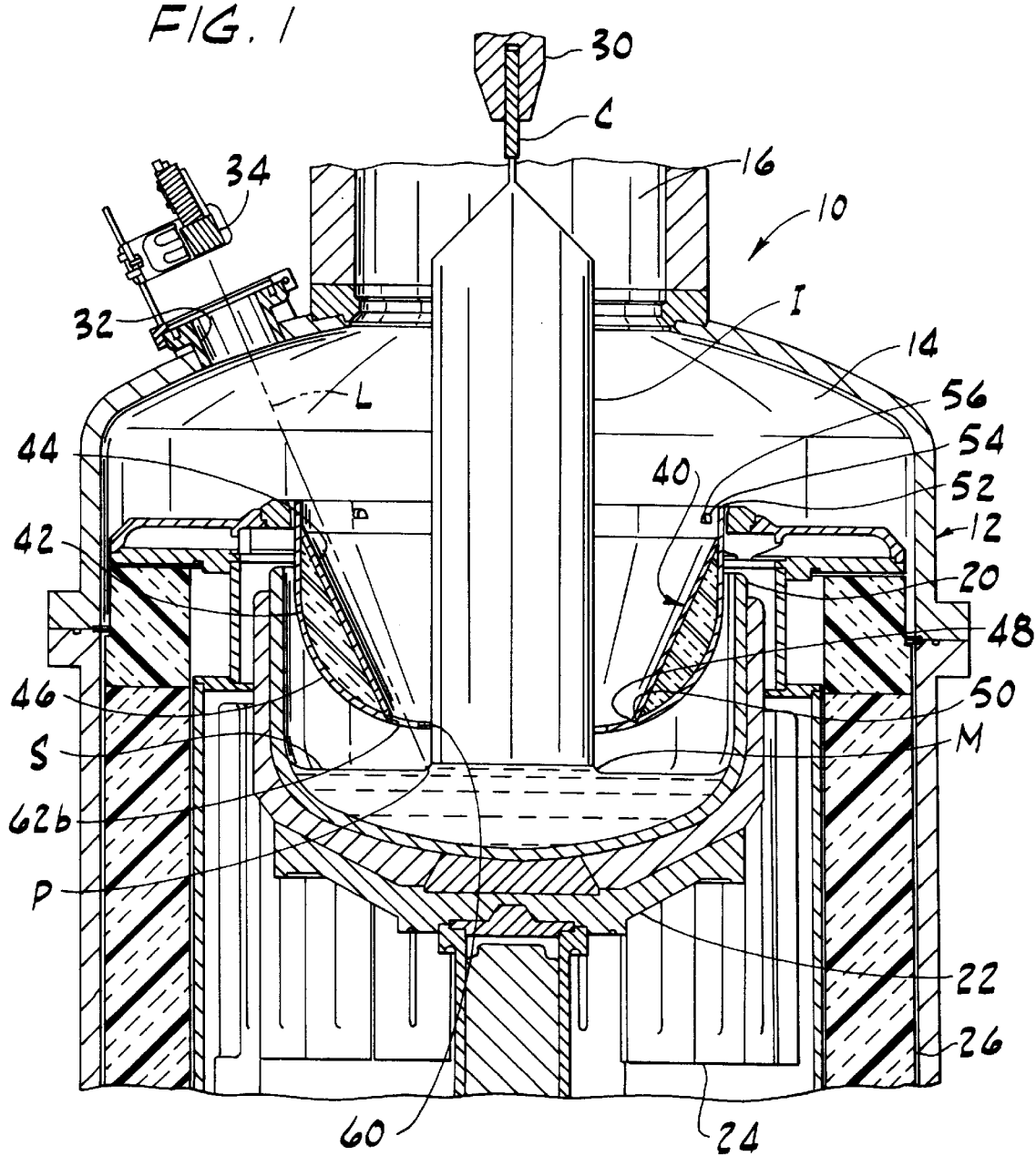
FIG. 1 is a schematic, fragmentary vertical cross section of a heat shield and crystal puller of the present invention.

Referring now to the drawings and in particular to FIG. 1, a crystal puller is designated in its entirety by the reference numeral 10. The puller 10 is used to grow monocrystalline ingots I of the type used to manufacture semiconductor wafers. The crystal puller 10 includes a water cooled shell (generally indicated at 12) having an interior which includes a crystal growth chamber 14 and a pull chamber 16 disposed above the growth chamber. A quartz crucible 20 is positioned within the growth chamber 14 for holding molten semiconductor source material S from which the monocrystalline silicon ingot I is grown. The crucible 20 is mounted on a motorized turntable 22 which rotates the crucible about a vertical axis and raises the crucible to maintain the surface of the molten source material S at a constant level as the ingot I grows and source material is removed from the melt.

A heater 24 surrounding the crucible 20 melts the source material S in the crucible 20. The heater 24 is controlled by an external control system (not shown) so that the temperature of the molten source material is precisely controlled throughout the pulling process. Insulation 26 surrounding the heater 24 reduces the amount of heat lost through the sides of the shell 12 and helps to keep the exterior walls of the puller relatively cool.

A pulling mechanism 30 (only a portion of which is shown in FIG. 1) rotates a seed crystal C and moves it up and down through the growth chamber 14 and the pull chamber 16. First, the mechanism 30 lowers the seed crystal C through the chambers 14, 16 until it contacts the surface of the molten source material S. Then the pulling mechanism 30 slowly raises the crystal C through the chambers 14, 16 to grow the monocrystalline ingot I. The speed at which the pulling mechanism 30 rotates the crystal C and the speed at which the pulling mechanism raises the crystal (i.e., the pull rate v) are controlled by the external control system. The control system also controls the speed at which the crucible 20 moves during the pulling process.

A view port 32 extends through the shell 12 so a camera 34 mounted above the port can view the ingot I as it grows. The camera 34 is aimed into the growth chamber 16 so it views three separate points P (only one of which is shown in FIG. 1) on a meniscus M formed between the ingot I and the upper surface of the molten source material S. The positions of these three points P are used in a known algorithm to calculate the diameter of the ingot I so that operating parameters such as the pull rate and material temperature may be adjusted to control the ingot diameter. The general construction and operation of the crystal puller 10, except to the extent explained more fully below, is conventional and known by those of ordinary skill in the art.

A heat shield, generally designated 40, is mounted above the upper surface of the molten source material S. Although other configurations are envisioned as being within the scope of the present invention, the heat shield 40 of the preferred embodiment generally includes an insulating layer 42 sandwiched between coaxially positioned inner and outer reflectors 44, 46, respectively. The inner reflector 44 is conical so it tapers inwardly downward to reflect heat upward toward the ingot I as it grows. The inner reflector 44 has a central opening 48 which permits the ingot I to pass through the heat shield 40. A lower edge of the inner reflector 44 surrounding the central opening 48 rests in a groove 50 formed in the outer reflector 46. The outer reflector 46 is bowl shaped so that it reflects heat downward away from the ingot I and directs convective air currents outwardly as they rise through the crucible 20. A rim 52 provided around the upper edge of the outer reflector 46 includes holes 54 for releasably attaching the heat shield 40 to the puller 10 with fasteners 56. Although other materials may be used without departing from the scope of the present invention, the inner and outer reflectors 44, 46, respectively, of the preferred embodiment are made from eight mm thick quartz. The insulating layer 42 used in the preferred embodiment is carbon bonded carbon fiber insulation material.

Figure 2:
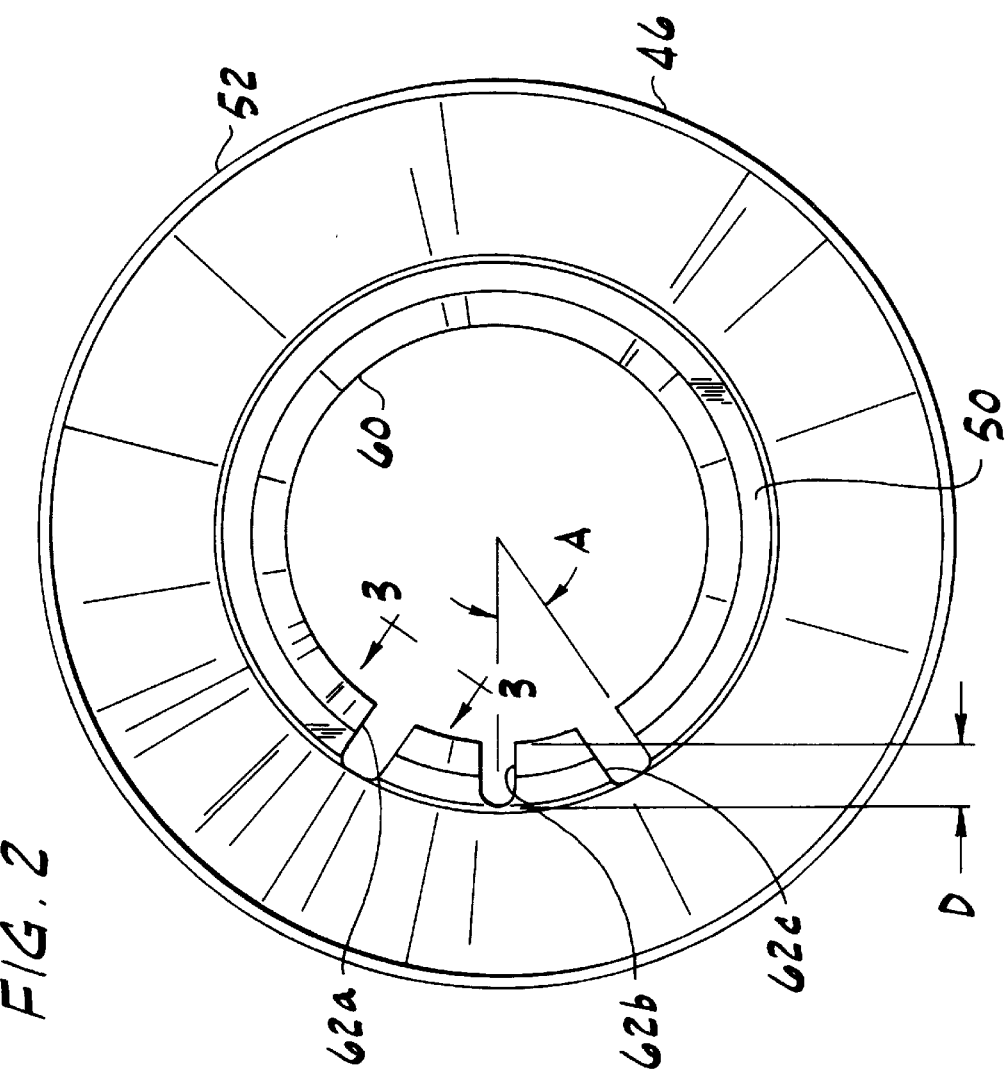
FIG. 2 is a top plan of an outer reflector of the heat shield.

As illustrated in FIG. 2, the outer reflector 46 has a central opening 60 which is aligned with the central opening 48 of the inner reflector 44 and which is sized and shaped for surrounding the ingot I as the ingot is grown. For example, the central opening 60 of the preferred embodiment is generally circular to accommodate the generally circular cross section of the cylindrical ingot I. Further, the diameter of the central opening 60 of the preferred embodiment, which is intended for use with pullers 10 for growing ingots I having a nominal maximum target diameter of about 200 mm, is about 220 mm in diameter. Although reflectors 46 having different sized central openings 60 may be used without departing from the scope of this invention, the central opening of the most preferred embodiment has a diameter which is no more than about ten percent larger (i.e., 1.1 times larger) than the predetermined maximum target diameter of the ingot I. Thus, the heat shield opening 60 has a diameter which equals the maximum target diameter of the ingot plus the tolerance of that diameter and some margin to account for the runout tolerance of the pulling mechanism 30 with respect to the heat shield opening.

As further shown in FIG. 2, the outer reflector 46 has three passages 62a–62c extending through the reflector adjacent the central opening 60. As illustrated in FIG. 1, when the heat shield 40 is supported in the crystal puller 10 between the molten material S and the camera 34, each of these passages 62a–62c is located along an imaginary line L (only one of which is shown in FIG. 1) extending between the camera and one of the points P on the meniscus M toward which the camera is aimed. These passages 62a–62c permit the camera 34 to view the points P so the positions of the points can be determined for calculating the diameter of the ingot I. Although the embodiment shown only has three passages 62a–62c, the heat shield 40 may have more passages if the camera 34 is intended to view more points P on the meniscus M.

As illustrated in FIG. 2, the passages 62a–62c of the preferred embodiment are U-shaped notches opening into the central opening 60 of the outer reflector 46. Each of the passages 62a–62c is positioned on an arc so that the end passages 62a, 62c are oriented at an angle A of about 150 to about 500 with respect to the middle passage 62b, and most preferable they are oriented at an angle of about 350 with respect to the middle passage. As will be understood by those skilled in the art, this passage orientation permits the camera 34 to view three points P on the meniscus M which are spaced at 45° intervals. Experience has shown that this point spacing results in an accurate measurement of the ingot I diameter.

Figure 3:
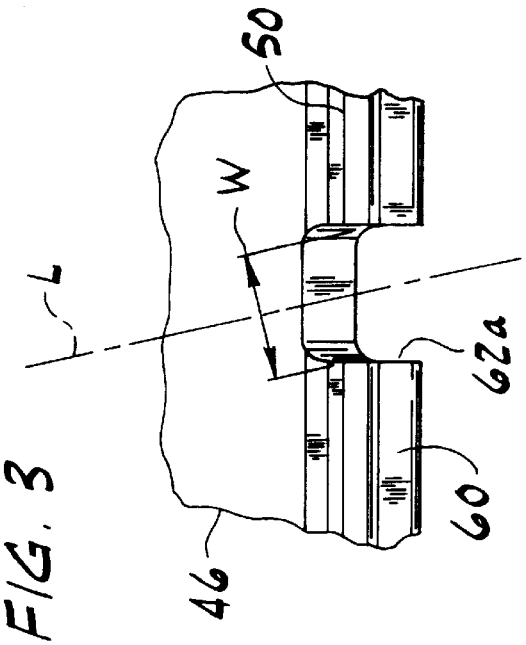
FIG. 3 is a fragmentary elevation of the outer reflector as seen from the vantage indicated by line 3—3 of FIG. 2.

As illustrated in FIG. 3, the passages 62a–62c have effective viewing widths W measured perpendicular to the corresponding imaginary line L which are wide enough to permit the camera 34 to view a sufficient area around the meniscus M so that it can distinguish the meniscus from the ingot I and the surface of the molten material S so that the positions of the points P can be determined accurately. However, the widths W of the passages 62a–62c must be minimized to reduce heat loss through the passages. Although the passages 62a–62c may have other effective viewing widths W without departing from the scope of the present invention, the passages of the preferred embodiment have effective viewing widths of about 10 mm. This results in each of the end passages 62a, 62c being wider than the middle passage 62b as shown in FIG. 2 to account for the foreshortening which occurs along the imaginary lines L passing through the end passages. Moreover, for heat shields 40 having central openings 60 for accommodated ingots I with diameters of 200 mm or larger, this results in the central opening diameter being no more than about ten percent larger than the predetermined maximum target diameter of the ingot around at least about 325 degrees of its circumference. Thus, heat loss through the central opening 60 and passages 62a–62c is minimized. The radially outer ends of the passages 62a–62c are rounded to reduce stress concentrations in the reflector 46. Each of the passages 62a–62c has a length D of about 40 mm to account for foreshortening along the imaginary lines L and to permit the camera 34 to view the points P even when the level of the molten material surface S varies. In the preferred embodiment, the passages 62a–62c have a combined area of less than about 30.4 square centimeters. Thus configured, the passages permit the camera 34 to view the preselected points P on the meniscus M so the diameter of the ingot I can be calculated, but prevent significant heat loss from the molten material S.

In order to prove the effectiveness of the heat shield 40 described above, analyses of ingot I temperature gradients $G_o$ were performed for a heat shield of the present invention and for a prior art heat shield. The prior art heat shield did not have passages. Rather, the prior art shield had a central opening which was large enough to permit the camera to view the meniscus through the opening. Thus, the diameter of the prior art heat shield central opening was about 1.5 times as large as the target ingot diameter as compared to the analyzed embodiment of the heat shield of the present invention which was about 1.1 times as large as the target ingot diameter. The results of the analyses are shown in FIGS. 4 and 5.

Figure 4:
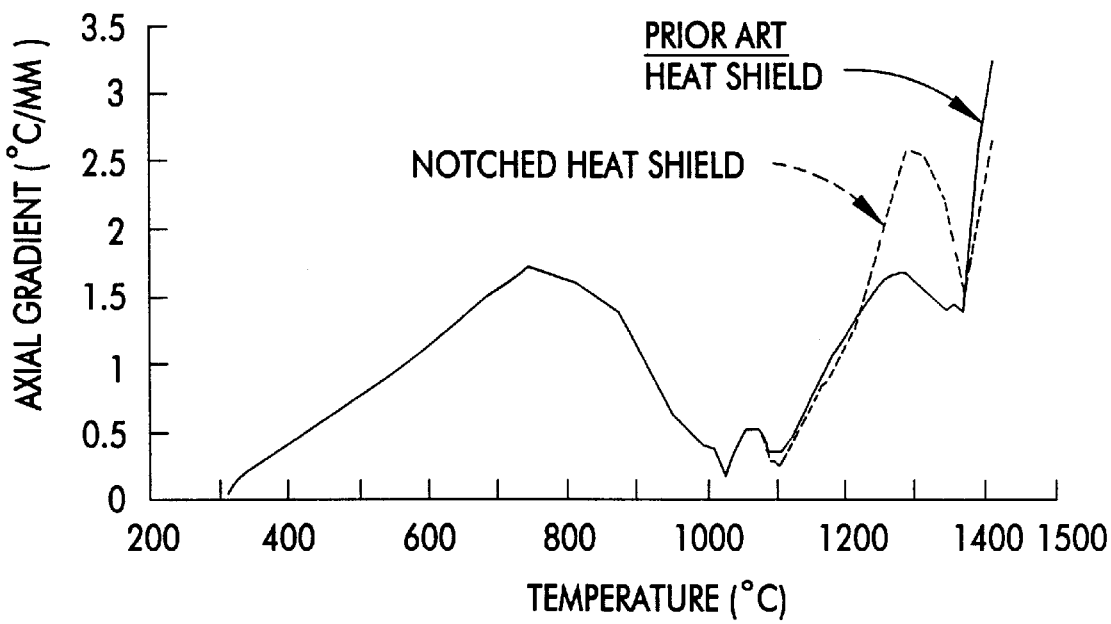
FIG. 4 is a plot of the axial temperature gradient in the ingot as a function of the surface temperature of the ingot along its length.

FIG. 4 shows the axial temperature gradient $G_o$ through the ingot as a function of the surface temperature of the ingot. In general, the overall maximum temperature gradient should be minimized, but the ingot should be cooled rapidly upon solidification until it reaches a temperature range where defect nucleation occurs (e.g., between about 1150° C. and about 1050° C. for silicon) so that the process duration is minimized. In the range where defects nucleate, the temperature gradient $G_o$ must be as low as possible to avoid the initiation of defects. After the surface temperature falls below the nucleation temperature, the ingot should be cooled rapidly again to minimize the period of time during which defect agglomeration can occur. A comparison of the results for the prior art heat shield (the solid line in FIG. 4) and the heat shield of the present invention (the dashed line in FIG. 4), shows that the heat shield of the present invention is more effective than that of the prior art.

As can be seen from the maxima at the right end of the curves in FIG. 4, the overall maximum axial gradient, which occurs at the solidification interface (i.e., generally adjacent the 1425° C. melt surface), is lower for the heat shield of the present invention than for the prior art heat shield. Moreover, the axial gradient over the surface temperature range of about 1400° C. to about 1250° C. is higher for the heat shield of the present invention than for the prior art heat shield. This results in the ingot cooling faster which reduces the duration of the pulling process. In the temperature ranges where defect nucleation and agglomeration occur (i.e., below about 1150° C.), both the prior art heat shield and the heat shield of the present invention result in about the same axial gradients. Thus, the heat shield of the present invention reduces the overall temperature gradient, the number of defects and the process duration as compared to the prior art heat shield.

Figure 5:
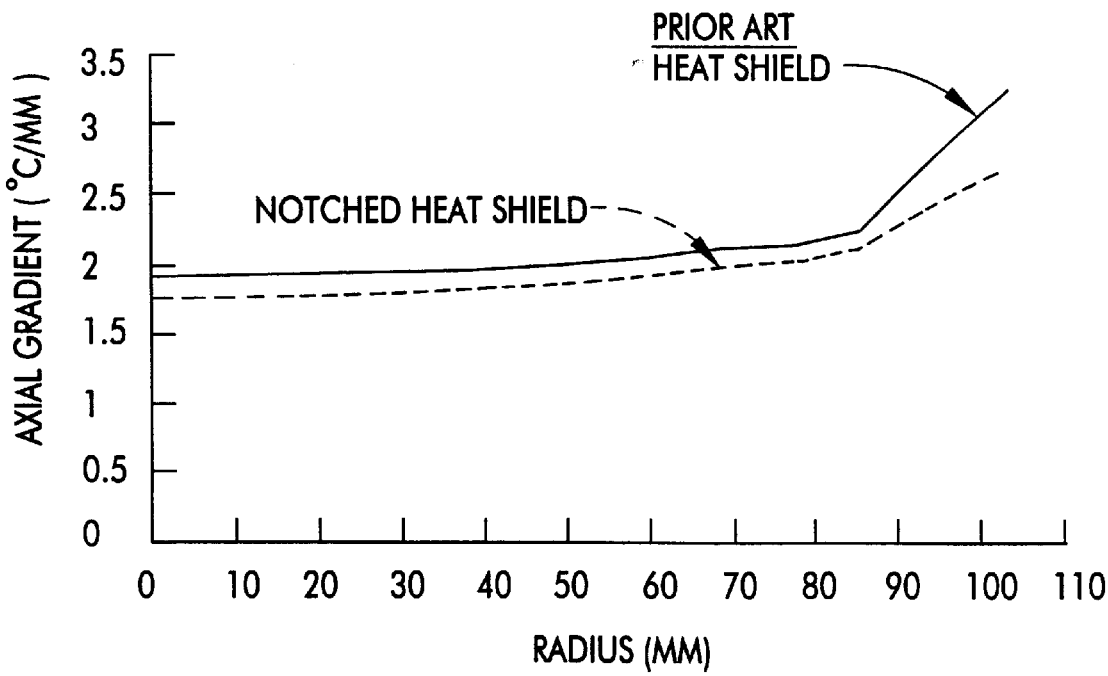
FIG. 5 is a plot of the axial temperature gradient in the ingot at the solidification interface as a function of radius.

Further, as shown in FIG. 5, the heat shield of the present invention results in a lower axial temperature gradient $G_o$ in the outer region of the ingot. Because of the effects of convective and radiant cooling at the surface of the ingot, the surface tends to cool faster and consequently the temperature gradient at the outer surface tends to be higher. Since the gradient is higher at the surface, more defects form in the outer region of the ingot. Ideally, the temperature gradient would be the same at any radius, i.e., the curve in FIG. 5 would be flat. By reducing the overall temperature gradient as shown in FIG. 4, the overall gradient at the surface is reduced which reduces the number of defects at the surface. Thus, the distribution of defects is more even throughout the ingot for ingots produced with the heat shield of the present invention than for ingots produced with prior art heat shields.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A crystal puller for forming a monocrystalline ingot, the crystal puller comprising:

a crucible for holding molten semiconductor source material from which the monocrystalline ingot is grown;

a heater for heating the crucible;

a pulling mechanism for pulling the ingot from the molten material;

a camera positioned about the molten material, the camera being aimed toward at least three separate points on a meniscus formed between the ingot and an upper surface of the molten material; and a heat shield located between the molten material and the camera, the heat shield having a central opening sized and shaped for surrounding the ingot as the ingot is grown to reduce heat transfer from the crucible, the heat shield having at least three passages extending through the heat shield, each of the passages being located along an imaginary line extending between the camera and one of said points on the meniscus thereby to permit the camera to view the points so the positions of the points can be determined for calculating the diameter of the ingot while minimizing heat loss through the passages.

2. A crystal puller as set forth in claim 1 wherein the passages are notches extending outward from the central opening of the heat shield.

3. A crystal puller as set forth in claim 2 wherein the passages include a middle passage and end passages positioned on opposite sides of the middle passage.

4. A crystal puller as set forth in claim 3 wherein each of the passages is positioned on an arc and each of said end passages is separated from the middle passage by an angle of about 15° to about 50° measured along the arc.

5. A crystal puller as set forth in claim 4 wherein each of the end passages is separated from the middle passage by an angle of about 35° measured along the arc.

6. A crystal puller as set forth in claim 5 wherein each of the end passages is wider than the middle passage.

7. A crystal puller as set forth in claim 1 wherein the heat shield is bowl shaped.

8. A crystal puller as set forth in claim 1 wherein the heat shield comprises a first reflector and a second reflector generally co-axial with the first reflector.

9. A crystal puller as set forth in claim 8 further comprising an insulating layer positioned between said first and second reflectors.

10. A crystal puller as set forth in claim 1 wherein said central opening is circular and has a diameter which is about 1.1 times larger than the diameter of the ingot.

11. A crystal puller as set forth in claim 1 wherein the passages have a combined area of less than about 30.4 square centimeters.

12. A crystal puller as set forth in claim 1 wherein each of the passages has an effective viewing width measured perpendicular to said corresponding imaginary line of about ten millimeters.

13. A crystal puller as set forth in claim 1 wherein each of the passages has a length of about 40 millimeters.

* * * * *